US007545035B2

(12) United States Patent
Schoellkopf

(10) Patent No.: US 7,545,035 B2
(45) Date of Patent: Jun. 9, 2009

(54) SEMICONDUCTOR DEVICE HAVING SEVERAL ASSEMBLED INTEGRATED-CIRCUIT CHIPS AND METHOD OF ASSEMBLING AND ELECTRICALLY CONNECTING THE INTEGRATED-CIRCUIT CHIPS

(75) Inventor: Jean-Pierre Schoellkopf, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 152 days.

(21) Appl. No.: 11/598,545

(22) Filed: Nov. 13, 2006

(65) Prior Publication Data

US 2007/0108622 A1 May 17, 2007

(30) Foreign Application Priority Data

Nov. 15, 2005 (FR) .................................. 05 11544

(51) Int. Cl.
*H01L 23/48* (2006.01)
*H01L 23/34* (2006.01)

(52) U.S. Cl. ....................... 257/723; 257/618; 257/774; 257/777; 257/698; 257/E21.597

(58) Field of Classification Search ................. 257/723, 257/692, 698, 618, 686, 777, E21.597
See application file for complete search history.

(56) References Cited

U.S. PATENT DOCUMENTS 3,528,173 A 9/1970 Gall
4,328,530 A * 5/1982 Bajorek et al. .............. 361/762
4,950,173 A 8/1990 Minemura et al.
4,965,702 A * 10/1990 Lott et al. .................. 361/764
5,031,072 A 7/1991 Malhi et al.
5,432,729 A 7/1995 Carson et al.
5,682,062 A * 10/1997 Gaul .......................... 257/686
7,226,809 B2 * 6/2007 Poo et al. .................... 438/109

FOREIGN PATENT DOCUMENTS

DE 40 36 093 A1 5/1992
EP 0 317 083 A2 5/1989
WO WO 02/13253 2/2002

OTHER PUBLICATIONS

Preliminary French Search Report, FR 05 11544, dated Jun. 21, 2006.

* cited by examiner

*Primary Examiner*—Nitin Parekh
(74) *Attorney, Agent, or Firm*—Gardere Wynne Sewell LLP

(57) ABSTRACT

A semiconductor device includes several assembled integrated-circuit chips. A main integrated-circuit chip has at least one cavity in which electrical contacts are provided. A secondary integrated-circuit chip includes an edge which engages in the cavity of the main chip and has electrical contacts. When the secondary integrated-circuit chip is inserted into the cavity, the electrical contacts of the main chip and the electrical contacts of the secondary chip are placed so as to be in contact with one another.

20 Claims, 5 Drawing Sheets

16 3 15 14 22 20 6 4 1 II II 8 12 11 10 5 2 18 17 19 21 7 9a 9 13

SEMICONDUCTOR DEVICE HAVING SEVERAL ASSEMBLED INTEGRATED-CIRCUIT CHIPS AND METHOD OF ASSEMBLING AND ELECTRICALLY CONNECTING THE INTEGRATED-CIRCUIT CHIPS

PRIORITY CLAIM

The present application claims priority from French Application for Patent No. 05 11544 filed Nov. 15, 2005, the disclosure of which is hereby incorporated by reference.

BACKGROUND OF THE INVENTION

1. Technical Field of the Invention

The present invention relates to the field of semiconductor devices having several assembled integrated-circuit chips.

2. Description of Related Art

It is known to mount a first integrated-circuit chip on an electrical connection support board, either by means of electrical connection balls or by means of an adhesive, and by making the electrical connections between the first chip and the support board by metal wires.

It is also known to flat-mount a second integrated-circuit chip on said first chip and to make the electrical connections for the second chip to the support board by metal wires and/or to the first chip if the latter has metal front pads.

It is also known to flat-stack several chips one on top of another.

The above assemblies require a mechanical chip assembly operation, then an operation of bonding the electrical connection wires, followed in general by an encapsulation operation.

There is a need in the art to simplify the operation of assembling integrated-circuit chips.

SUMMARY OF THE INVENTION

An aspect of the present invention is a semiconductor device having several assembled integrated-circuit chips.

In accordance with an embodiment, this device comprises at least one main integrated-circuit chip having at least one cavity in which electrical contact means are provided, and at least one secondary integrated-circuit chip, one edge of which is engaged in said cavity of said main chip and has electrical contact means, the electrical contact means of said main chip and the electrical contact means of said secondary chip being placed so as to be in contact with one another.

The electrical contact means of said secondary chip and the electrical contact means of said main chip preferably consist of contact areas and projecting connection tabs, respectively.

Preferably, said secondary chip has a rear face that bears against a rear bearing wall of said cavity and a front face having exposed electrical contact areas and said main chip includes electrical connection tabs extending into said cavity and in contact with said contact areas.

Said connection tabs are preferably formed by the extensions of electrical connection tracks integrated into said main chip and extending from a front wall of said clarity on the opposite side from its aforementioned rear bearing wall and at a certain distance from the bottom of said cavity.

Said connection tabs are preferably bent over in the direction of engagement of the secondary chip in the cavity and kept in contact with said contact areas owing to their elasticity.

Said connection tabs preferably have end parts that define surfaces in contact with said contact areas.

Said electrical contact areas of said secondary chip extend parallel to and in the direction of the engagement of the secondary chip in the cavity.

Said electrical contact areas of said secondary chip preferably extend from the edge of the latter.

The length of said connection tabs is preferably at least equal to 1.2 times the gap between said contact areas of said secondary chip and said front wall of said cavity.

Said cavity preferably has end walls for positioning said secondary chip in the direction of the aforementioned end of the latter.

The device may advantageously include means for bonding the end of the secondary chip in the cavity of the main chip.

The device may advantageously include means for encapsulating said end of said secondary chip in the cavity of said main chip.

As a variant, said main chip has several parallel cavities in which electrical contact means are provided. The device may then include several secondary integrated-circuit chips, one end of which is engaged in a respective cavity of said main chip and has electrical contact means in contact with the electrical contact means of this cavity.

According to another variant, the device includes at least a second main chip having at least one cavity in which electrical contact means are provided, another end of said secondary chip being engaged in this cavity of said second main chip and provided with electrical contact means in contact with said electrical contact means of said second main chip.

Another aspect of the present invention is a method of assembling and electrically connecting the integrated-circuit chips.

In accordance with an embodiment, this method comprises: producing a main integrated-circuit chip and in providing at least one cavity in this chip in such a way that it has, in this cavity, electrical contact means; producing a secondary integrated-circuit chip in such a way that it has electrical contact means along one end; and engaging said end of said secondary chip in the cavity of said main chip in such a way that their contact means come into contact with one another.

This method may produce a main integrated-circuit chip that includes integrated parallel track portions having aligned ends and provide said cavity in such a way that the end parts of said track portions constitute cantilevered tabs in said cavity, at a certain distance from the bottom of the latter, which constitute its electrical contact means.

Preferably, the method comprises, during engagement of said secondary chip in said cavity of said main chip, bending said electrical contact tabs to an amount below their yield point.

This method may comprise producing a secondary integrated-circuit chip in such a way that its electrical contact means are formed by contact areas on a front face.

Preferably, during engagement of said secondary chip, the method comprises placing a rear face of the latter, on the opposite side from its aforementioned front face, so as to bear on a rear bearing face of said cavity of said main chip and bringing the contact means of said main chip into contact with said contact areas of said second chip.

In an embodiment, a semiconductor device comprises a first integrated circuit chip having a front face in which is formed a slot cavity which exposes first electrical contacts, and a second integrated circuit chip having a front face which includes exposed second electrical contacts. The second integrated circuit chip is inserted into, and is received by, the slot cavity of the first integrated circuit chip such that the first electrical contacts touch the second electrical contacts so as to electrically interconnect the first and second integrated circuit chips.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE PREFERRED EMBODIMENTS

Figure 1:
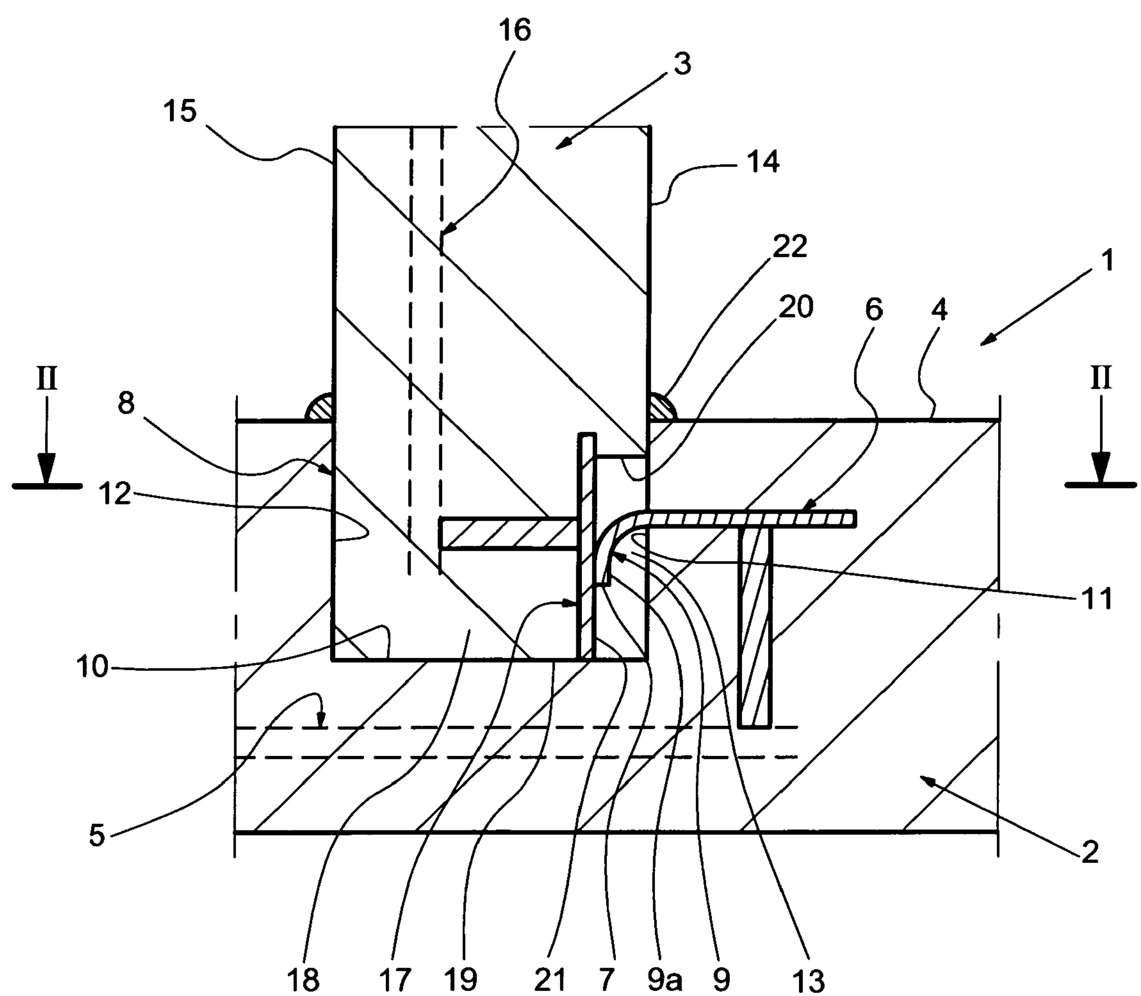
FIG. 1 shows a partial cross-sectional view of a semiconductor device according to the invention, comprising assembled main and secondary integrated-circuit chips.
Figure 2:
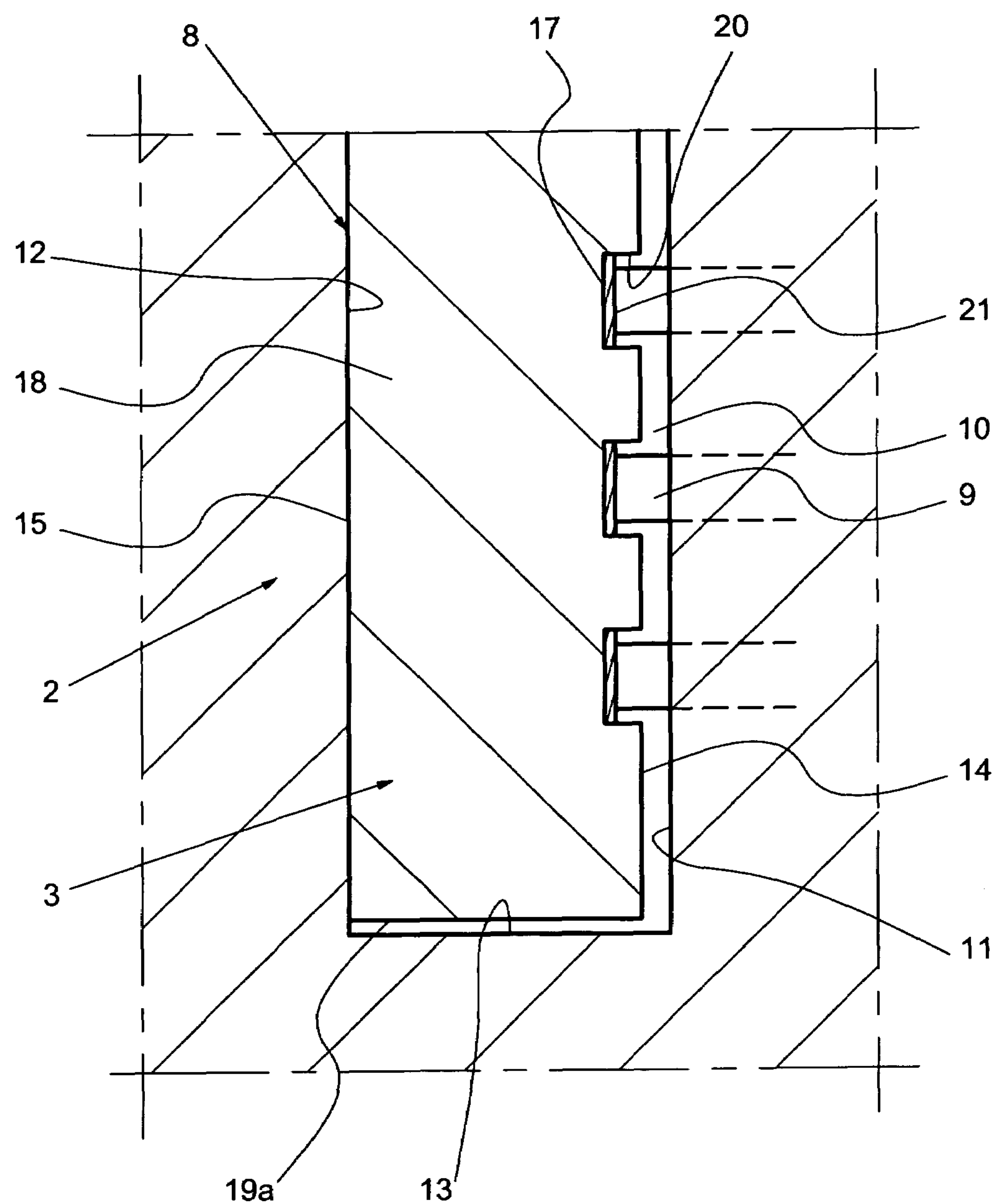
FIG. 2 shows a partial cross section, along II-II of the device of FIG. 1.

Referring to FIGS. 1 and 2, there is shown a semiconductor device 1 that includes a main chip 2, for example a square chip, and a secondary chip 3, for example a square chip, which are assembled and electrically connected.

Figure 3:
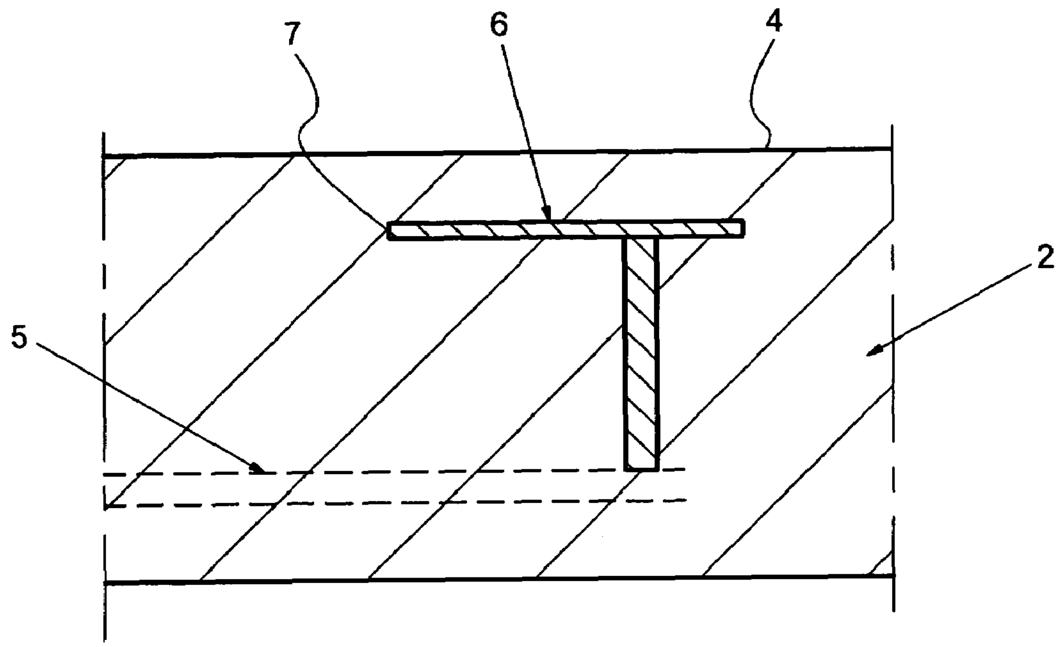
FIG. 3 shows a cross section of a main chip during fabrication.
Figure 4:
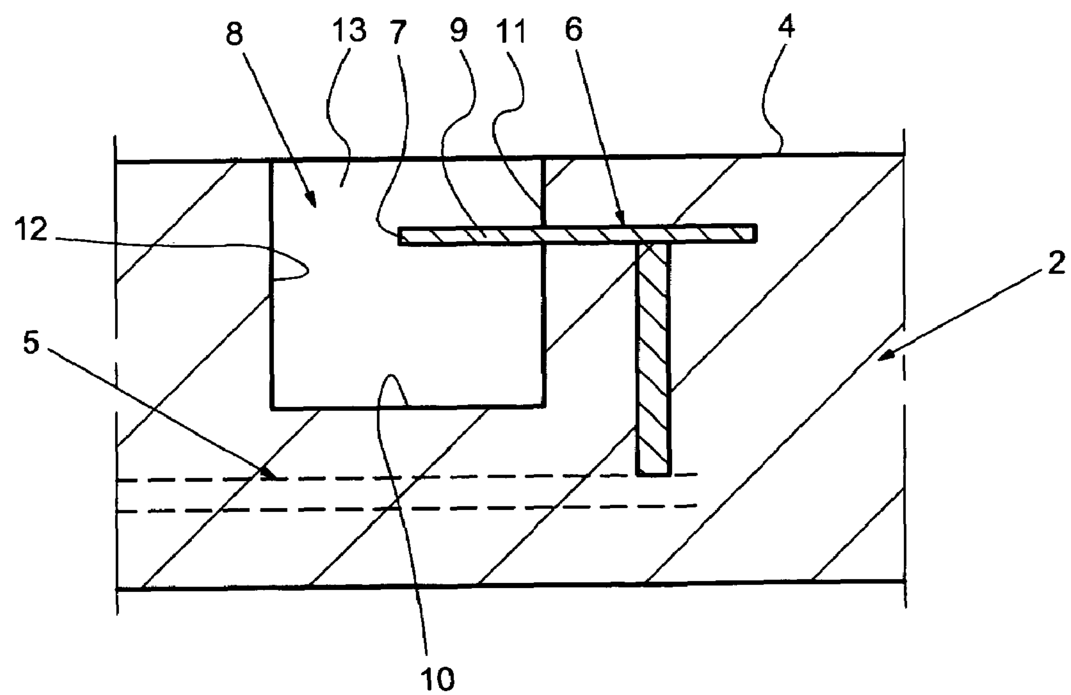
FIG. 4 shows a cross section of the main chip at the end of fabrication.

The way in which the main chip 2 can be obtained in its state before assembly will firstly be described with particular reference to FIGS. 3 and 4.

As shown in FIG. 3, the main chip 2 comprises, depth wise with respect to its front face 4, integrated electronic circuits 5. It further includes, a short distance from this front face 4, integrated metal electrical connection track portions 6 which are mutually parallel and have corresponding ends 7 that are aligned, these electrical connection track portions being selectively connected electrically to the integrated electronic circuits 5. The track portions 6 are for example produced below a surface passivation layer.

As shown in FIG. 4, starting from such a main chip, a rectangular cavity 8 is produced, by standard processes used in microelectronics, in the region of the end 7 of the track portions 6, from the front face 4 in such a way that the end parts of the track portions constitute cantilevered tabs 9 in the cavity 8, at a certain distance from the bottom 10 of the latter and a certain distance apart, these tabs constituting its electrical contact means. Of course, the cavity 8 is produced in a volume of the main chip 2 not having any circuit and any other integrated connection means.

The cavity 8 thus has a front wall 11 from which the electrical connection tabs 9 are cantilevered, a rear bearing wall 12 opposite the front wall 11, and opposed transverse walls 13, these walls being perpendicular to the front face 4, and the bottom 10 being parallel to this front face 4.

Figure 5:
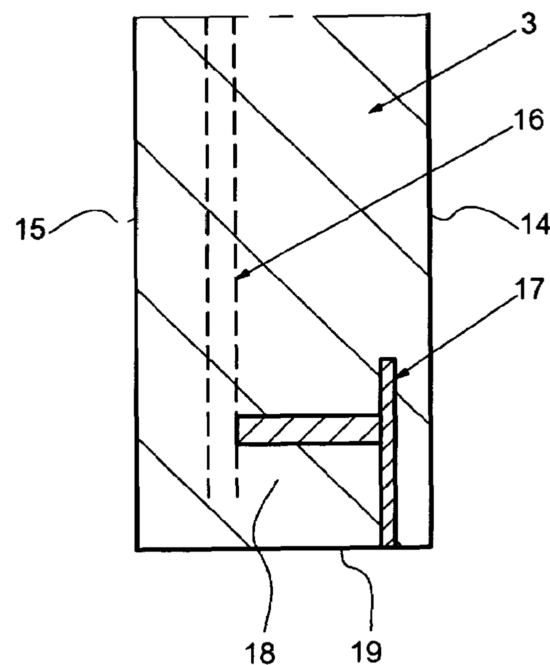
FIG. 5 shows a cross section of a secondary chip during fabrication.
Figure 6:
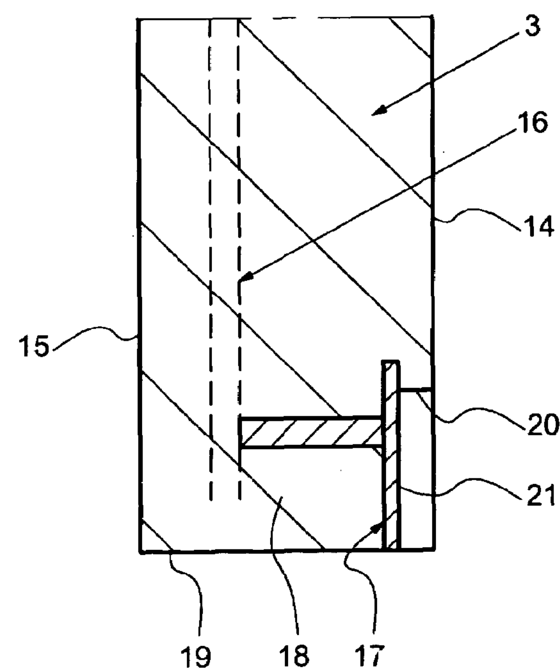
FIG. 6 shows a cross section of the secondary chip at the end of fabrication.
Figure 7:
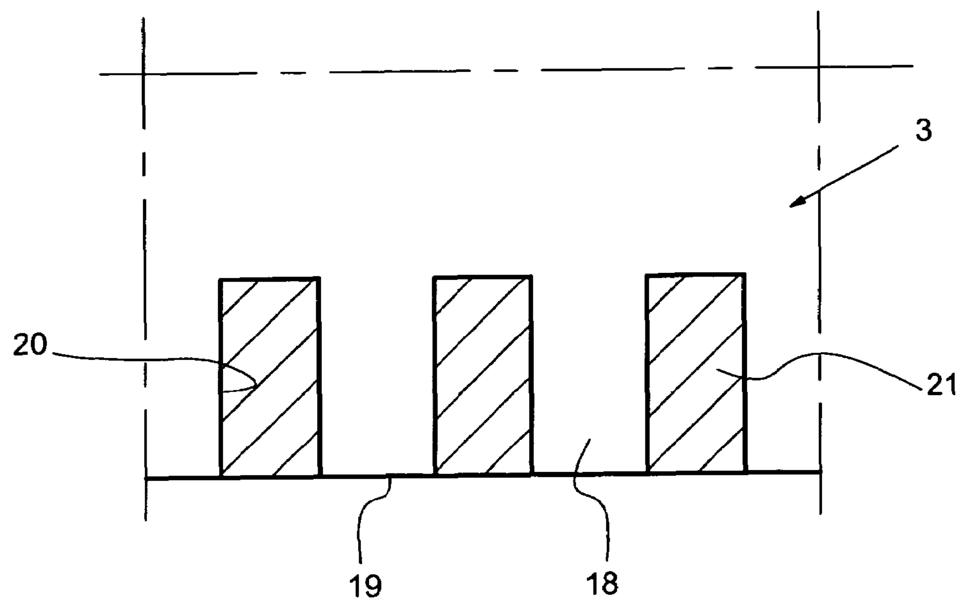
FIG. 7 shows a top view of the secondary chip at the end of fabrication.

Referring in particular to FIGS. 5 to 7, the way in which the secondary chip 3 may be obtained in its state before assembly will now be described.

The secondary chip 3 comprises, depthwise with respect to its front face 14 on the opposite side to its rear face 15, integrated electronic circuits 16. It further includes, a short distance from this front face 14, for example just below a surface passivation layer, integrated electrical connection track portions 17 that are produced along a lateral end 18 of the secondary chip 3 and extending as far as the edge 19 of this end 18, these integrated electrical connection track portions 17 being selectively connected electrically to the integrated electronic circuits 16.

As shown in FIGS. 6 and 7, starting from such a secondary chip, rectangular housings 20 are produced, by standard processes used in microelectronics from the front face 14, which housings 20 extend from the edge 19 and make it possible to expose electrical contact areas 21 on the track portions 17, a certain distance from one another, these connection areas 21 being elongate and extending perpendicular to the edge 19.

The dimensions of the main chip 2 and the secondary chip 3 relative to each other are the following.

The length of the cavity 8 of the main chip 2, between its opposed transverse walls 13, is slightly greater than the length of the lateral end 18 of the secondary chip 3.

The thickness of the secondary chip 3, between its front and rear faces 14 and 15, is smaller than the width of the cavity 8 between its front and rear walls 11 and 12.

The connection tabs 9 of the main chip 2 are placed, along the front wall 11 of its cavity 8, so as to be in correspondence with the electrical contact areas 21 of the secondary chip 3 along its lateral end 18, for example a regular spacing. The length of the connection tabs 9 is preferably at least equal to 1.2 times the gap between said contact areas 21 of said secondary chip 3 and the front wall 11 of the cavity 8.

To assemble the main chip 2 and the secondary chip 3, in order to obtain the device 1 as shown in FIGS. 1 and 2, the procedure is as follows.

The secondary chip 3 is placed on top of and perpendicular to the main chip 2, in a position such that the edge 19 and its lateral end 18 project into the cavity 8. Thus, the front face 14 of the secondary chip 3 is on the same side as the front face 11 of this cavity. The rear face 15 of the secondary chip 3 is on the same side as the rear bearing wall 12 of this cavity. The rear face of the secondary chip 3 is aligned with the rear wall 12 of the cavity 8 or slightly offset on the side facing the latter. The ends of the edge 19, formed by the opposed sides 19*a* of the secondary chip 3, are between and near the opposed transverse walls 13 of the cavity 8.

The lateral end 18 of the secondary chip 3 is then engaged in the cavity 8 of the main chip 2, until it comes into contact, via its edge 19, with the bottom of the cavity 8 of the main chip 2.

Having done this, the connection tabs 9 of the main chip 2 come into contact with the end corners of the contact areas 21 of the secondary chip 3, then bend over in the direction of engagement, towards the bottom of the cavity 8, and slide over these contact areas 21.

Having released the secondary chip 3, the rear face of the latter bears against the rear bearing wall 12 of the cavity 8 of the main chip 2 and the connection tabs 9 are bent and in contact with the contact areas 21 owing to their elasticity.

After this operation, the lateral end 18 of the secondary chip 3 is embedded in the cavity 8 of the main chip 2.

The length of the connection tabs 9 is preferably such that these tabs have end parts 9*a* that define contact surfaces on the contact areas 21.

The length of the cavity 8 of the main chip 2, the length of the end 18 of the secondary chip 3 and the relative arrangements of the connection tabs 9 and of the contact areas 21 with respect to one another are such that, during assembly, the connection tabs 9 end up on the contact areas 21 and not on the front face 14 of the secondary chip 3.

According to a variant, it would be possible to deposit, before assembly, either in the cavity 8 of the main chip 2 without reaching the connection tabs 9, or on the end 18 of the secondary chip 3, without reaching the contact areas 21, adhesive so as to firmly attach these chips to each other.

According to another variant, it would also be possible to deposit, after assembly, a bead 22 of an encapsulation material between the perimeter of the secondary chip 3 and the peripheral edge of the cavity 8 of the main chip 2 so as to constitute a mechanical link and a seal for protecting the connection tabs 9 and the contact areas 21.

Figure 8:
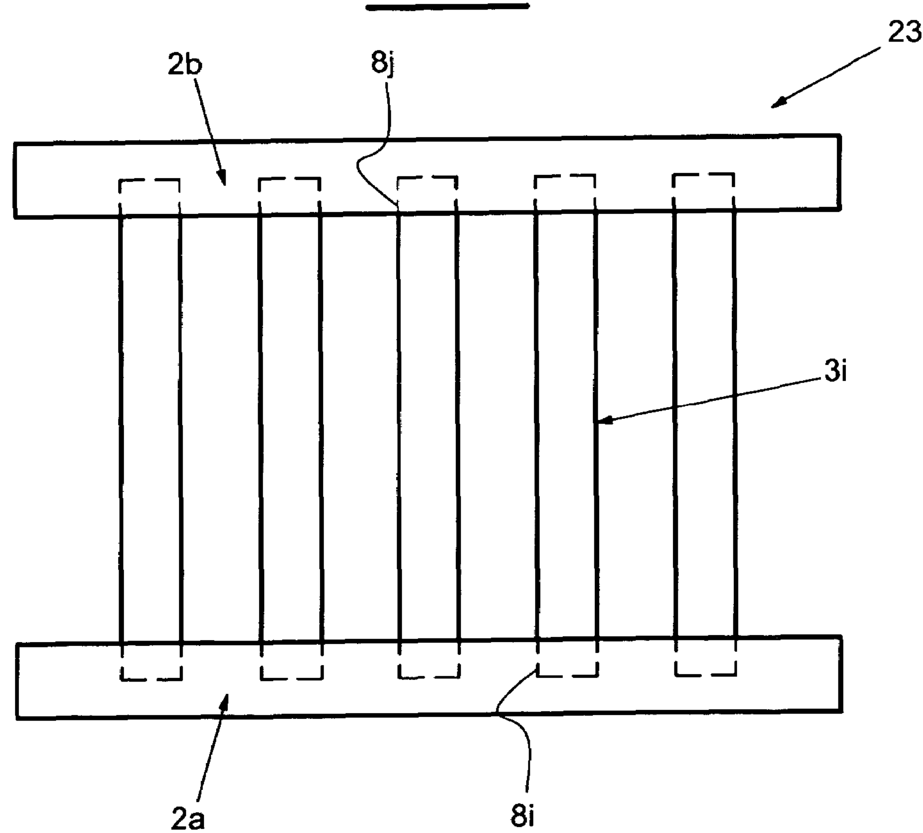
FIG. 8 shows a side view of another semiconductor device according to the invention, comprising several assembled main and secondary integrated-circuit chips.

FIG. 8 shows a semiconductor device 23 that comprises a main chip 2*a* and several secondary chips 3*i* that are parallel, assembled and electrically connected to the main chip 2*a*, as described above.

To do this, the main chip 2*a* has several parallel cavities 8*i* in which electrical connection tabs are provided, and the lateral ends of the secondary chips 3*i* have corresponding contact areas, as described above.

Advantageously, the secondary chips 3*i* may be arranged with a regular spacing.

When arranged in this way, the secondary chips 3*i* are easily ventilated and therefore cooled.

In addition, the semiconductor device 23 may advantageously include a second main chip 2*b*, opposite the main chip 2*a* and having cavities 8*j* to which the lateral ends of the secondary chips 3*i*, opposite their lateral ends coupled to the main chip 2*a*, are assembled and electrically connected as described above.

By extension, other main chips could be assembled and electrically connected, as described above, to the other lateral ends of the second chips 3*i*.

The present invention is not limited to the examples described above. Many variants are possible without departing from the scope defined by the appended claims.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A semiconductor device, comprising:

at least one main integrated-circuit chip having at least one cavity including a side wall;

first electrical contact means provided extending from the side wall into the cavity;

at least one secondary integrated-circuit chip, one edge of which is engaged in said cavity of said main integrated-circuit chip, second electrical contact means for the secondary integrated-circuit chip, wherein the first electrical contact means of said main integrated-circuit chip and the second electrical contact means of said secondary integrated-circuit chip are in contact with one another inside the cavity.

2. The device according to claim 1, wherein the second electrical contact means of said secondary integrated-circuit chip and the first electrical contact means of said main integrated-circuit chip comprise surface contact areas on the secondary integrated-circuit chip and projecting connection tabs from the side wall in the cavity of the main integrated-circuit chip, respectively.

3. The device according to claim 1, wherein said cavity has end walls.

4. The device according to claim 1, further including means for bonding the secondary integrated-circuit chip in the cavity of the main integrated-circuit chip.

5. The device according to claim 1, further including means for encapsulating said secondary integrated-circuit chip in the cavity of said main integrated-circuit chip.

6. The device according to claim 1, wherein said main integrated-circuit chip has several parallel cavities in which first electrical contact means are provided and further including several secondary integrated-circuit chips, one end of each of secondary integrated-circuit chips being engaged in a respective cavity of said main integrated-circuit chip and having second electrical contact means in contact with the first electrical contact means of this cavity.

7. The device according to claim 1, further including at least a second main integrated-circuit chip having at least one cavity in which first electrical contact means are provided, another end of said secondary integrated-circuit chip being engaged in this cavity of said second main integrated-circuit chip and provided with second electrical contact means in contact with said first electrical contact means of said second main integrated-circuit chip.

8. A semiconductor device comprising:

at least one main integrated-circuit chip having at least one cavity in which electrical contact means are provided;

at least one secondary integrated-circuit chip, one edge of which is engaged in said cavity of said main integrated-circuit chip, and having electrical contact means, wherein the electrical contact means of said main integrated-circuit chip and the electrical contact means of said secondary integrated-circuit chip are placed so as to be in contact with one another, and wherein said secondary integrated-circuit chip has a rear face that bears against a rear bearing wall of said cavity and a front face having exposed electrical contact areas, and wherein said main integrated-circuit chip includes electrical connection tabs extending into said cavity and in contact with said contact areas.

9. The device according to claim 8, wherein said connection tabs are formed by the extensions of electrical connection tracks integrated into said main integrated-circuit chip and extending from a front wall of said cavity on the opposite side from its aforementioned rear bearing wall and at a certain distance from the bottom of said cavity.

10. The device according to claim 9, wherein said connection tabs are bent over in a direction of engagement of the secondary integrated-circuit chip in the cavity and kept in contact with said contact areas owing to their elasticity.

11. The device according to claim 8, wherein said connection tabs have end parts that define surfaces in contact with said contact areas.

12. The device according to claim 8, wherein said electrical contact areas of said secondary integrated-circuit chip extend parallel to and in a direction of the engagement of the secondary integrated-circuit chip in said cavity.

13. The device according to claim 8, wherein said electrical contact areas of said secondary integrated-circuit chip extend from an edge of the secondary integrated-circuit chip.

14. The device according to claim 8, wherein the length of said connection tabs is at least equal to 1.2 times the gap between said contact areas of said secondary integrated-circuit chip and a front wall of said cavity.

15. A semiconductor device, comprising:

a first integrated circuit chip having a front face in which is formed a slot cavity which exposes first electrical contacts extending into the cavity from a first side wall of the cavity; and a second integrated circuit chip having a front face which includes exposed second electrical contacts;

wherein the second integrated circuit chip is inserted into, and is received by, the slot cavity of the first integrated circuit chip such that the first electrical contacts touch the second electrical contacts to electrically interconnect the first and second integrated circuit chips.

16. The device of claim 15 wherein the slot cavity includes a bottom wall and the first side wall from which the first electrical contacts extend into the cavity, and wherein the second integrated circuit includes a side edge, and wherein after insertion the side edge of the second integrated circuit chip is adjacent the bottom wall of the first integrated circuit chip slot cavity and the front face of the second integrated circuit chip is adjacent the first side wall of the first integrated circuit chip slot cavity.

17. The device of claim 15 further comprising means for securing the second integrated circuit in the slot cavity of the first integrated circuit chip.

18. The device of claim 15 wherein the first electrical contacts and the second electrical contacts each comprise metal electrical tracks of the first and second integrated circuit chips, respectively, which are located below a surface passivation layer of the integrated circuit.

19. A semiconductor device comprising:

a first integrated circuit chip having a front face in which is formed a slot cavity which exposes first electrical contacts; and a second integrated circuit chip having a front face which includes exposed second electrical contacts;

wherein the second integrated circuit chip is inserted into, and is received by, the slot cavity of the first integrated circuit chip such that the first electrical contacts touch the second electrical contacts so as to electrically interconnect the first and second integrated circuit chips, and wherein the first electrical contacts comprise tabs extending from a first side wall of the first integrated circuit chip slot cavity and bent down towards a bottom wall of the first integrated circuit chip slot cavity.

20. The device of claim 19 wherein the tabs have elastic properties.

* * * * *